United States Patent
Noda et al.

(10) Patent No.: US 7,477,336 B2
(45) Date of Patent: Jan. 13, 2009

(54) ACTIVE MATRIX SUBSTRATE, METHOD OF MANUFACTURING ACTIVE MATRIX SUBSTRATE, ELECTRO-OPTICAL DEVICE, AND ELECTRONIC APPARATUS

(75) Inventors: Yoichi Noda, Nagano (JP); Shinri Sakai, Nagano (JP); Atsushi Denda, Nagano (JP); Toshimitsu Hirai, Nagano (JP)

(73) Assignee: Seiko Epson Corporation (JP)

( * ) Notice: Subject to any disclaimer, the term of this patent is extended or adjusted under 35 U.S.C. 154(b) by 580 days.

(21) Appl. No.: 11/212,401

(22) Filed: Aug. 26, 2005

(65) Prior Publication Data

US 2006/0044486 A1    Mar. 2, 2006

(30) Foreign Application Priority Data

Aug. 27, 2004    (JP)    ............................ 2004-247919

(51) Int. Cl.
*G02F 1/1368* (2006.01)
*G02F 1/1343* (2006.01)

(52) U.S. Cl. .................... 349/43; 349/139; 349/187

(58) Field of Classification Search ............... 349/42, 349/43, 139, 143, 187; 257/59, 72, E27.111; 438/30, 92, 149, 151; 345/92
See application file for complete search history.

(56) References Cited

U.S. PATENT DOCUMENTS

| 5,930,607 | A | 7/1999 | Satou |
| 6,480,577 | B1 * | 11/2002 | Izumi et al. ................... 379/40 |
| 6,908,796 | B2 | 6/2005 | Furusawa |
| 7,208,764 | B2 * | 4/2007 | Furusawa ..................... 257/72 |
| 2004/0004678 | A1 * | 1/2004 | Furusawa ..................... 349/43 |

FOREIGN PATENT DOCUMENTS

| JP | 02-170135 | 6/1990 |
| JP | 06-160904 | 6/1994 |
| JP | 07-020494 | 1/1995 |
| JP | 10-048651 | 2/1998 |
| JP | 3261699 | 12/2001 |
| JP | 2002-090776 | 3/2002 |
| JP | 2003-318192 | 11/2003 |
| TW | 463383 | 6/2000 |

* cited by examiner

*Primary Examiner*—Dung T. Nguyen
*Assistant Examiner*—Tai Duong
(74) *Attorney, Agent, or Firm*—Harness, Dickey & Pierce, P.L.C.

(57) ABSTRACT

There is provided an active matrix substrate including, on a substrate: lattice-patterned wires, pixel electrodes arranged in an area surrounded with the wires, and switching elements electrically connected to the wires and the pixel electrodes with a conductive film therebetween, wherein an auxiliary conductive portion electrically connecting the pixel electrodes to the conductive film is further provided.

6 Claims, 15 Drawing Sheets

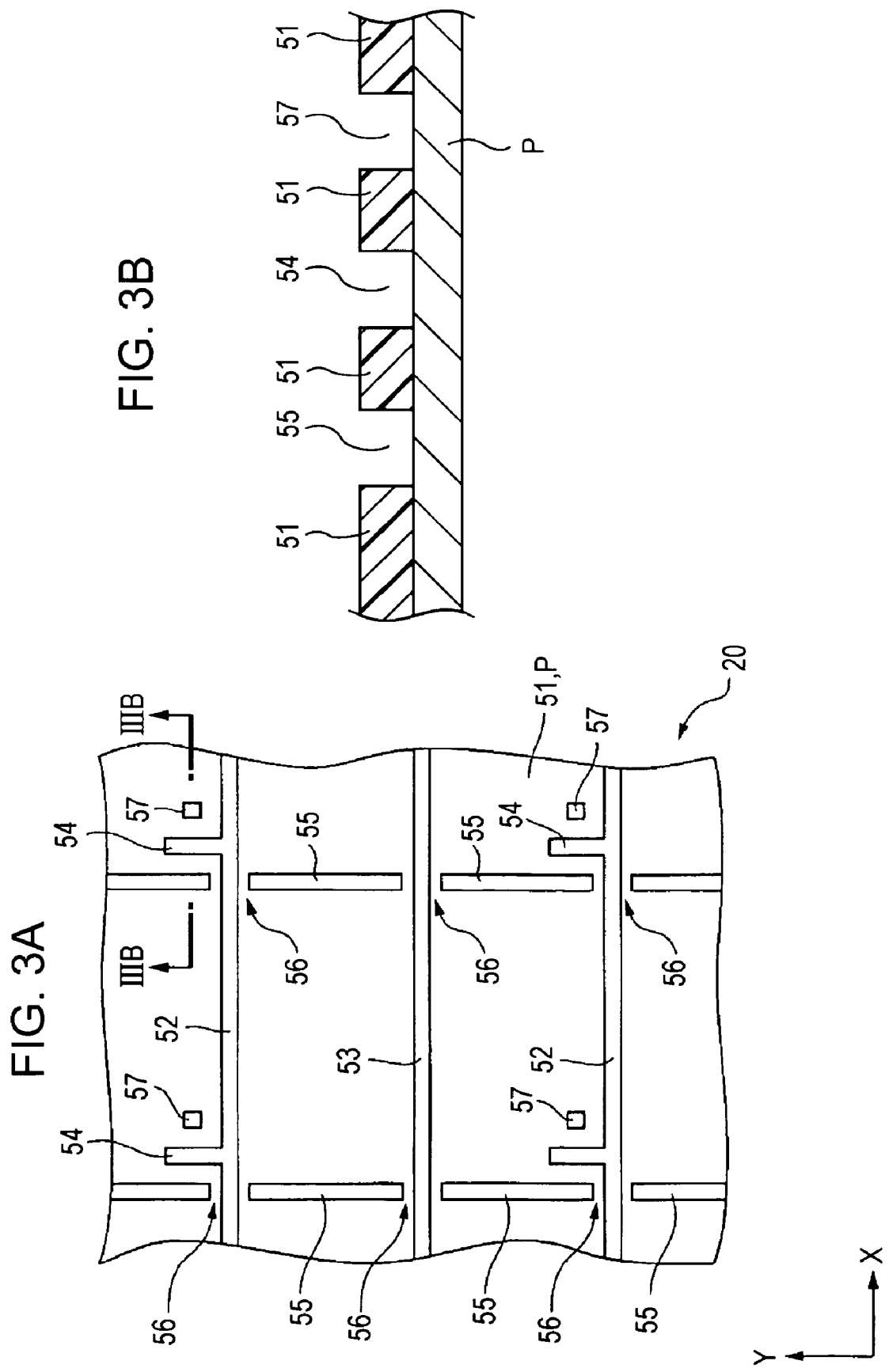

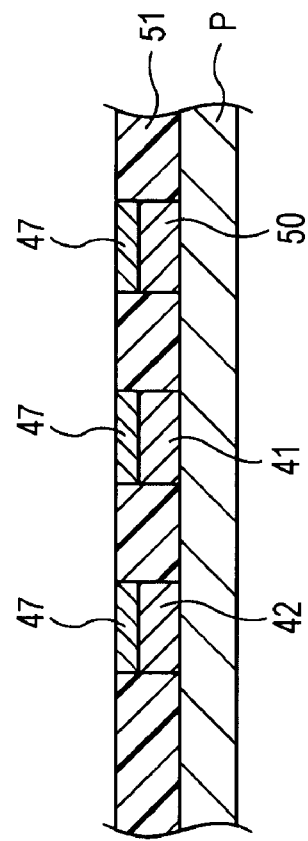
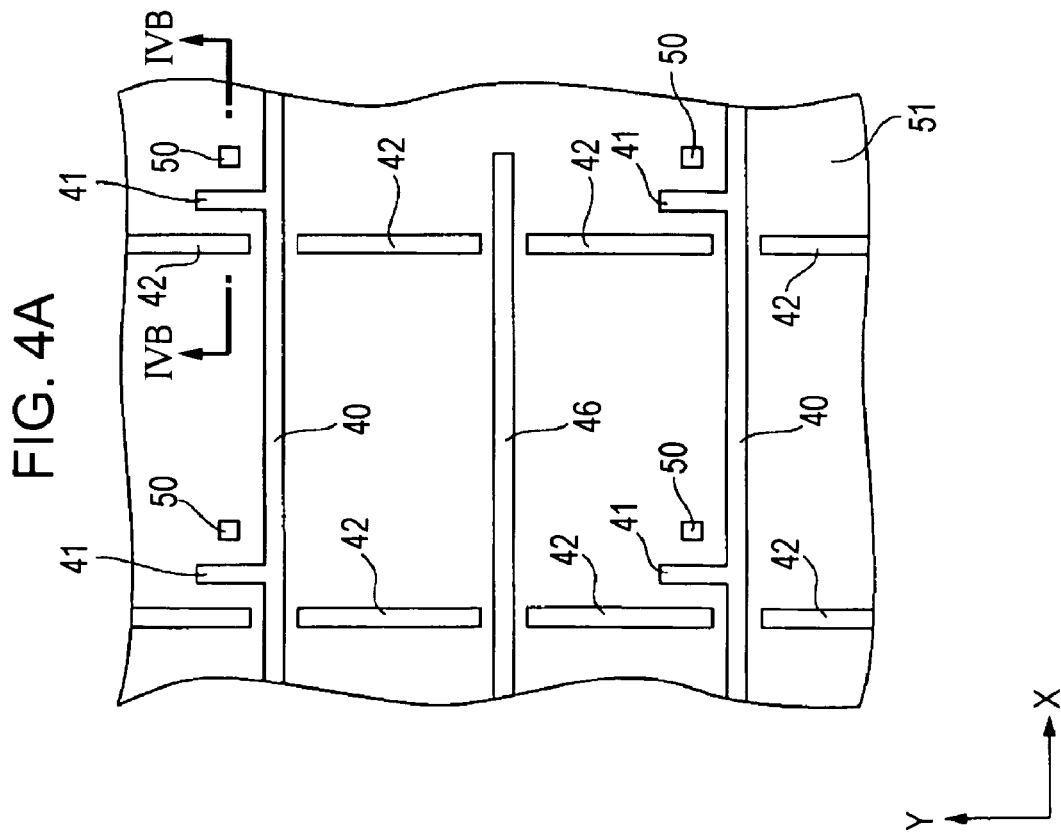
FIG. 4B
FIG. 4A

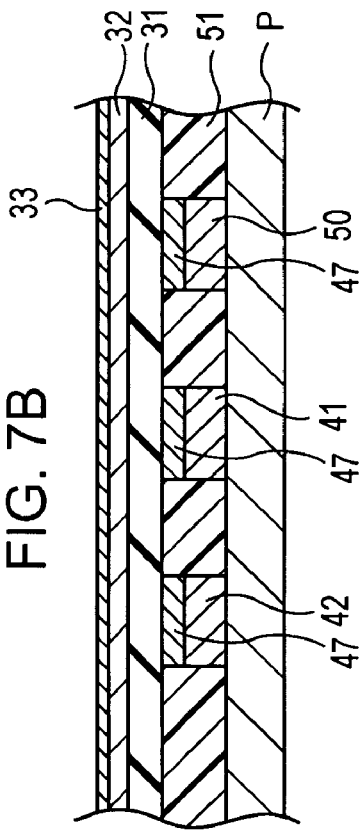
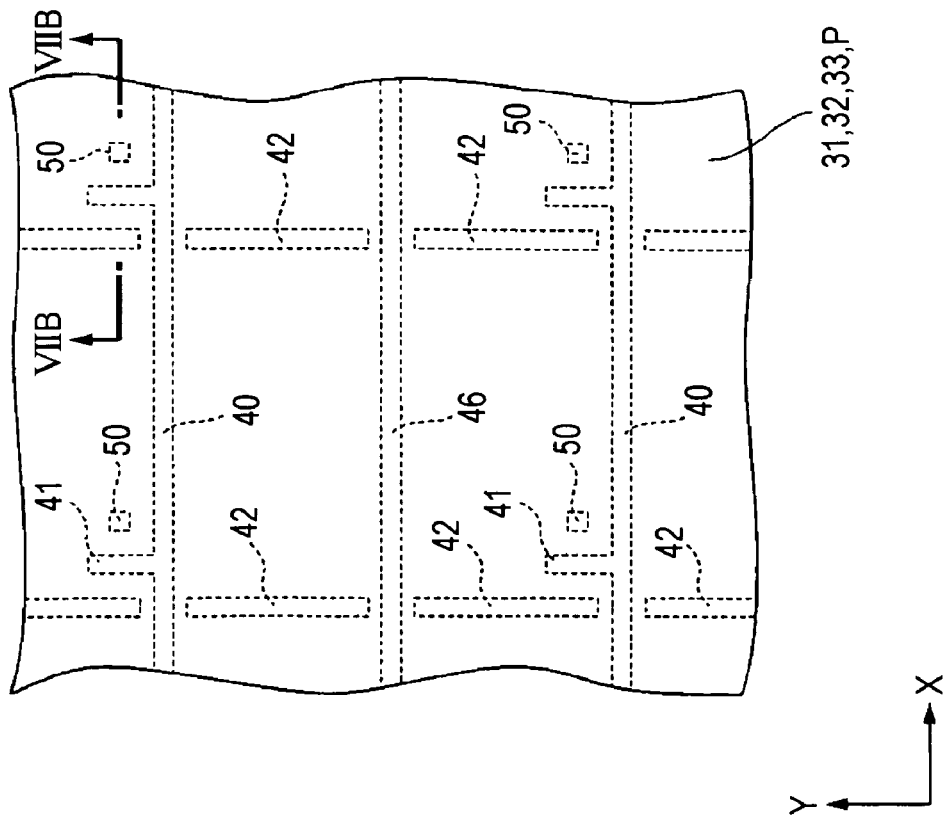

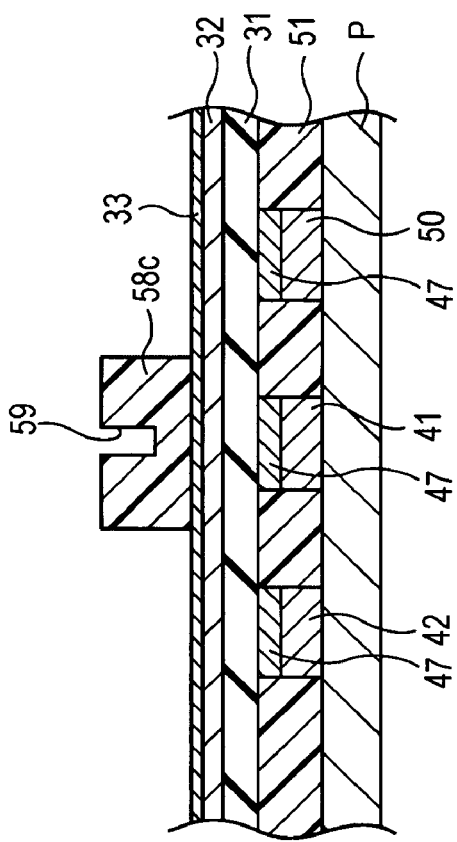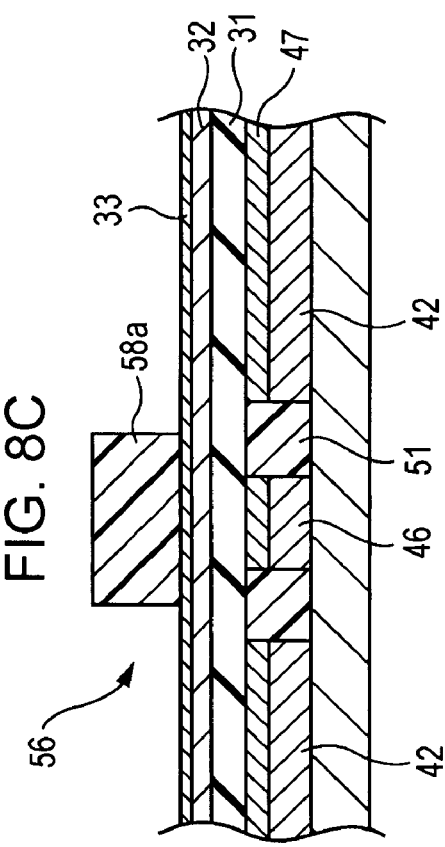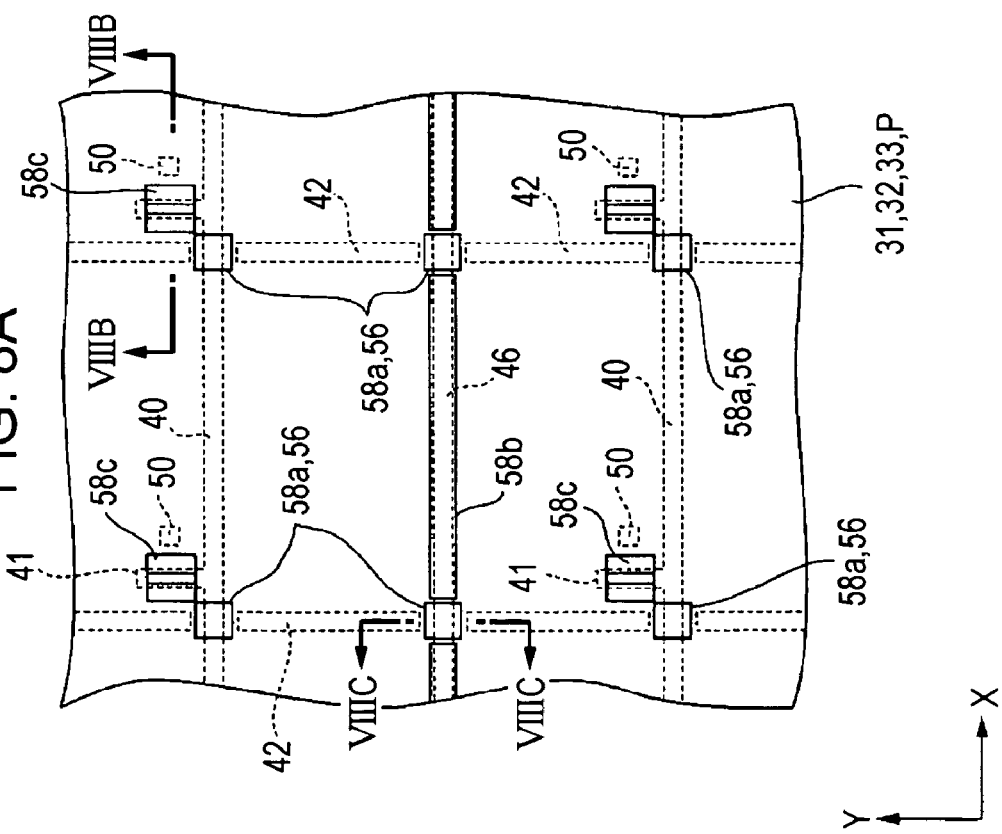

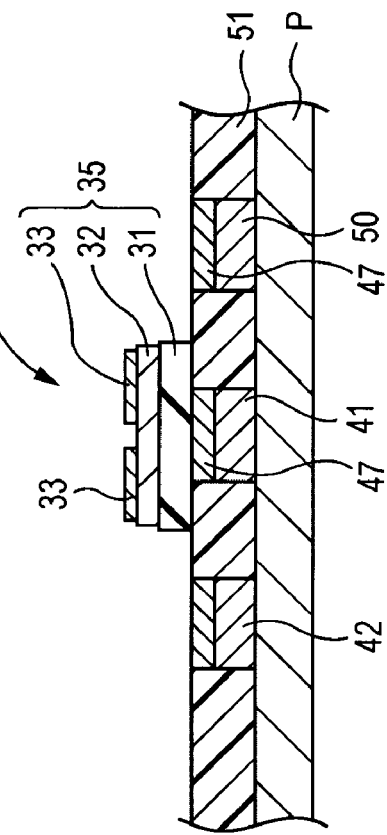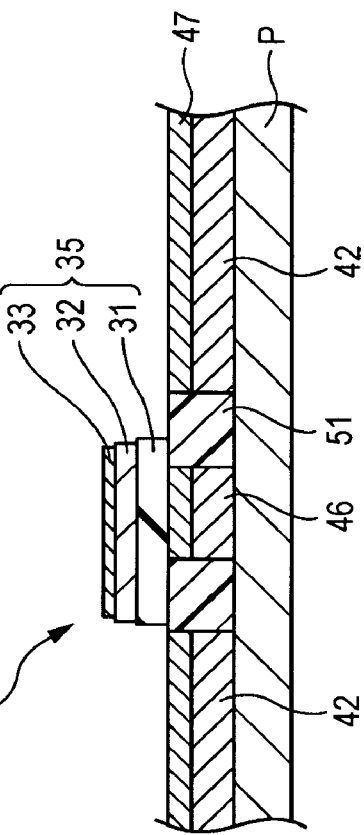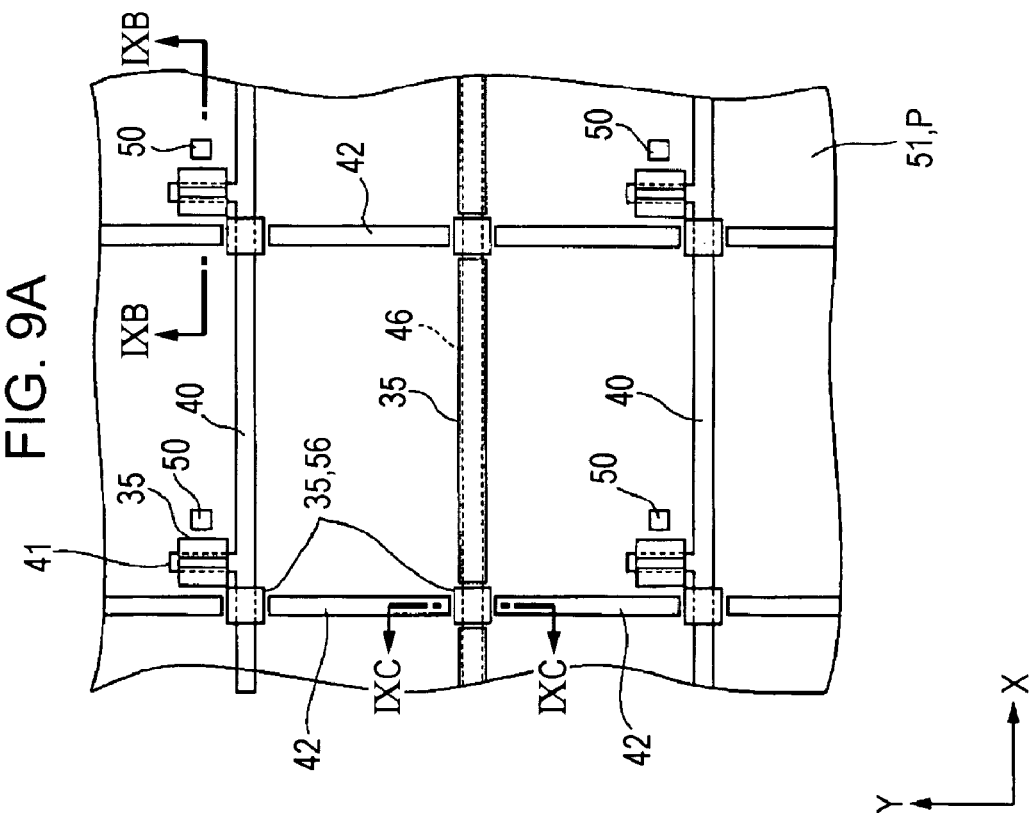

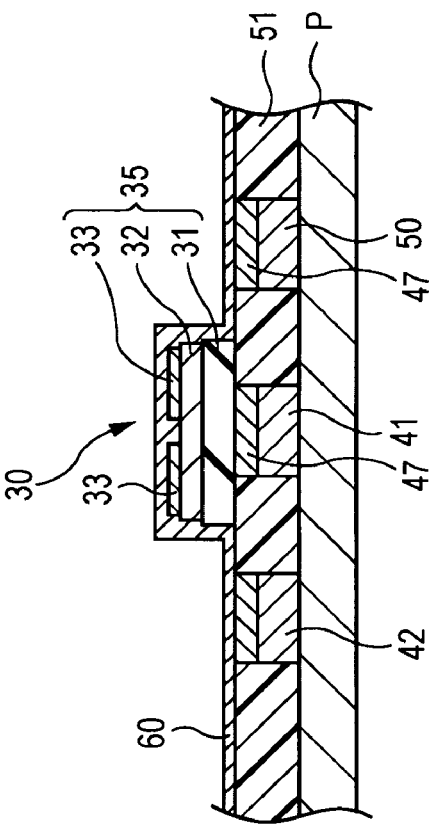
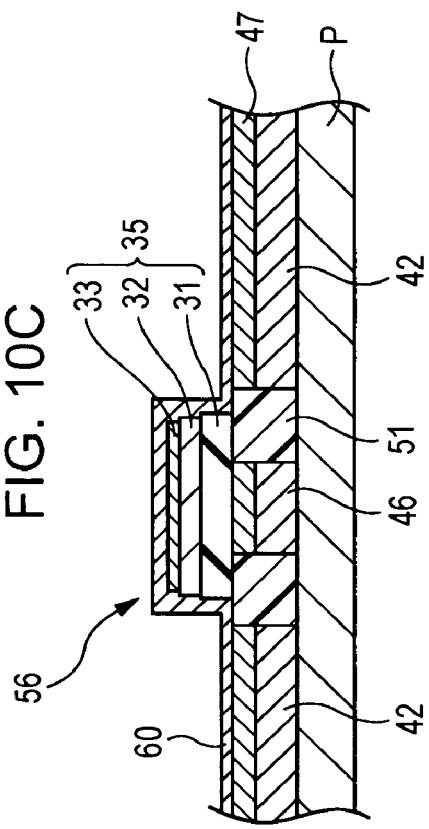

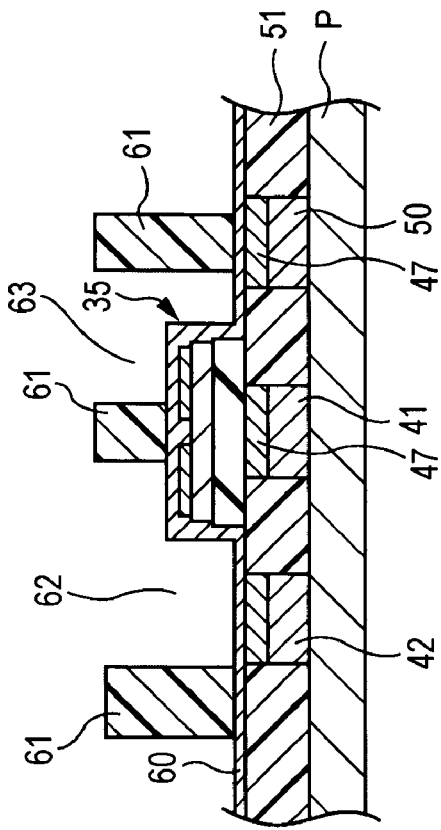
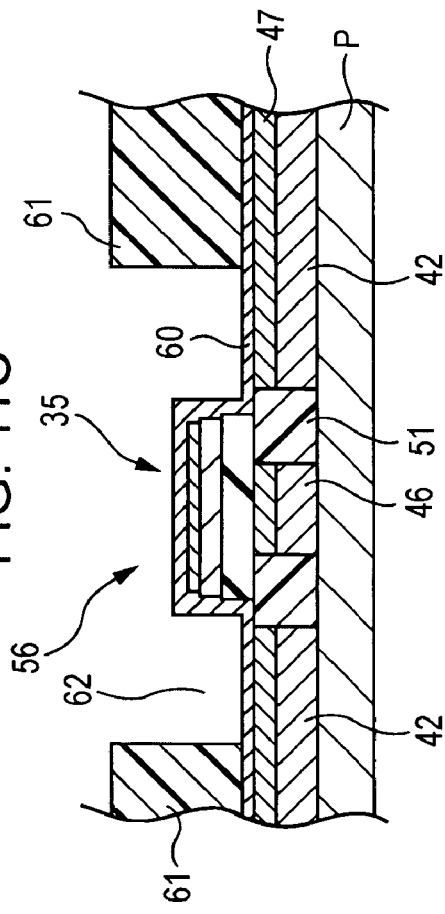
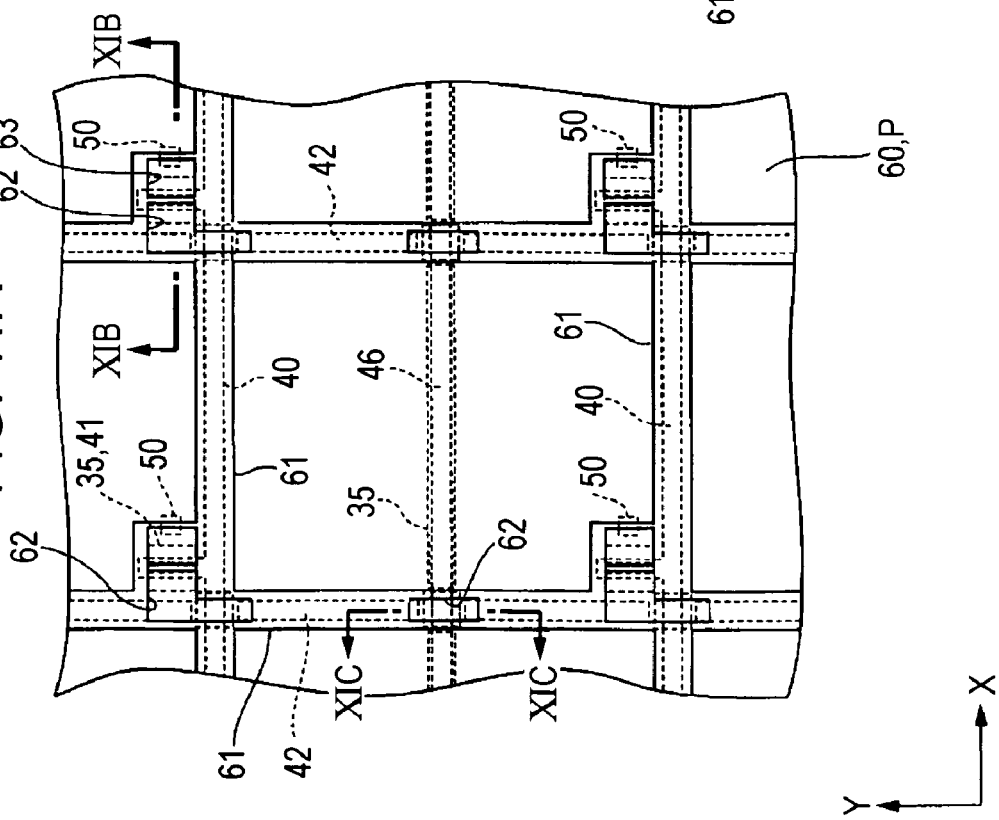

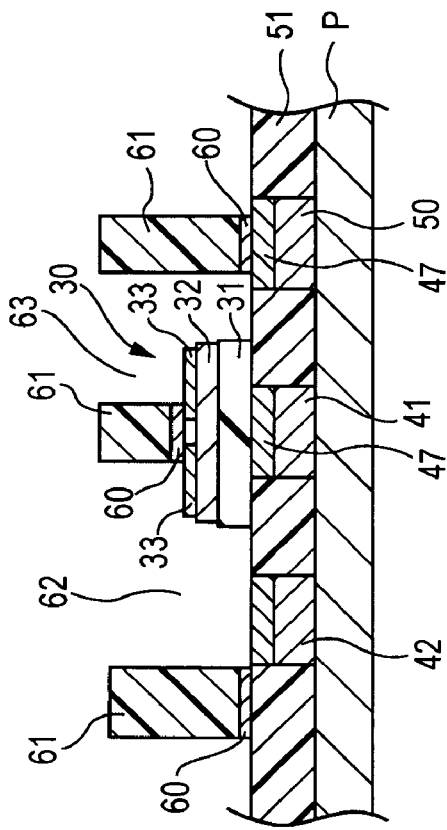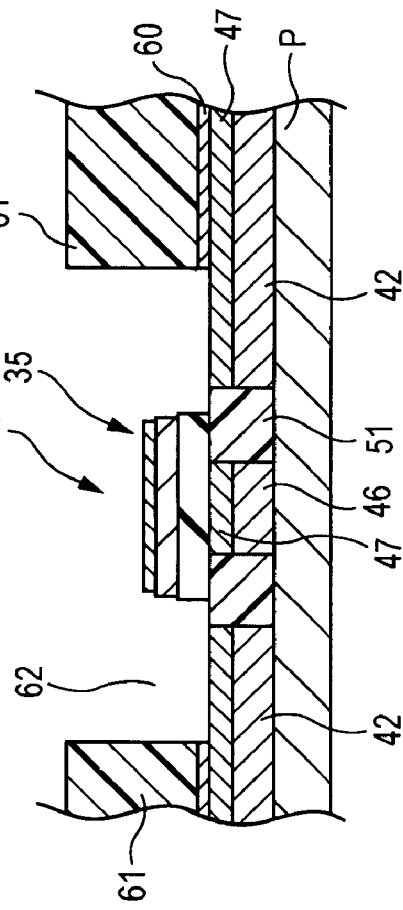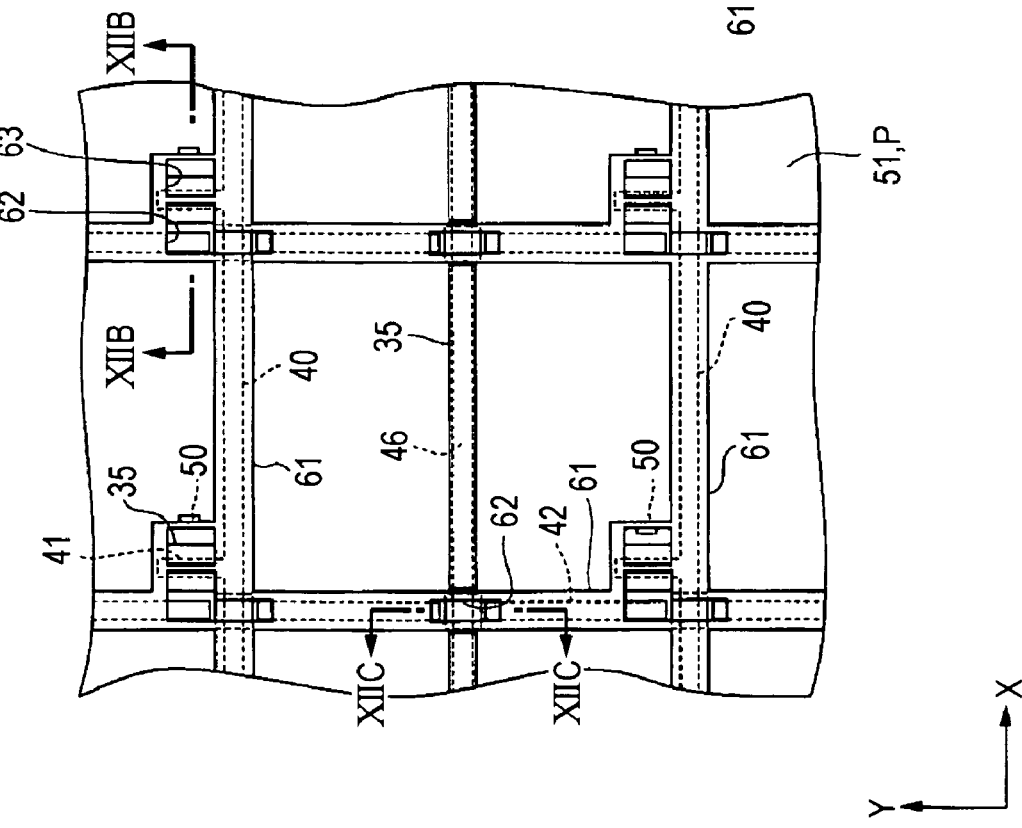

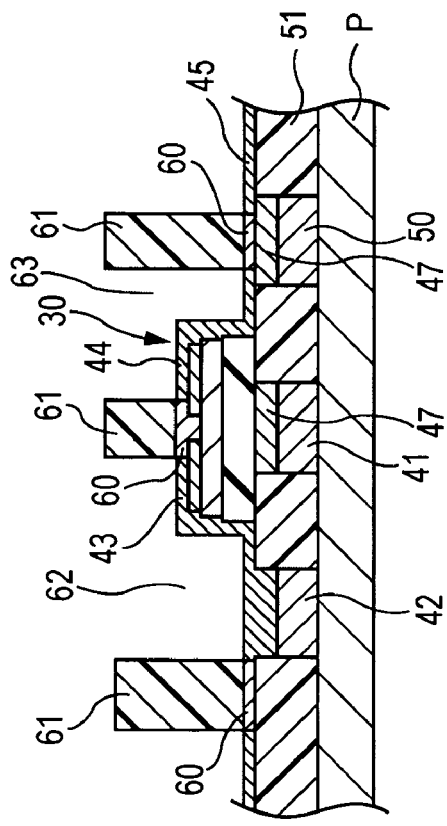
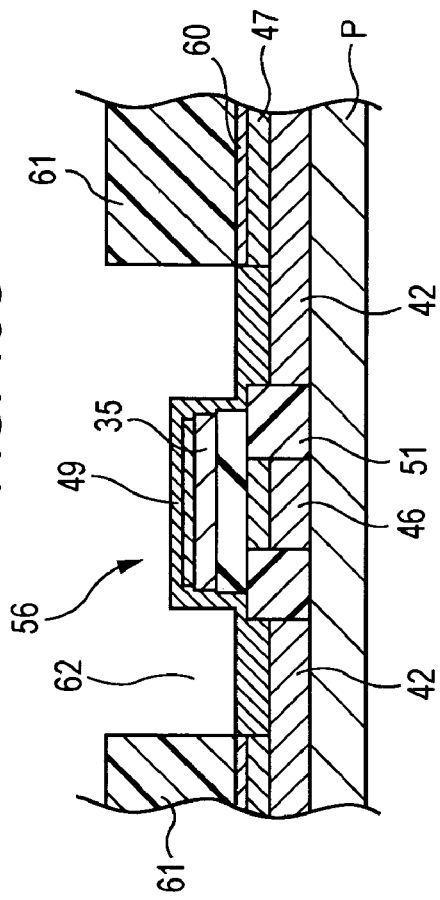
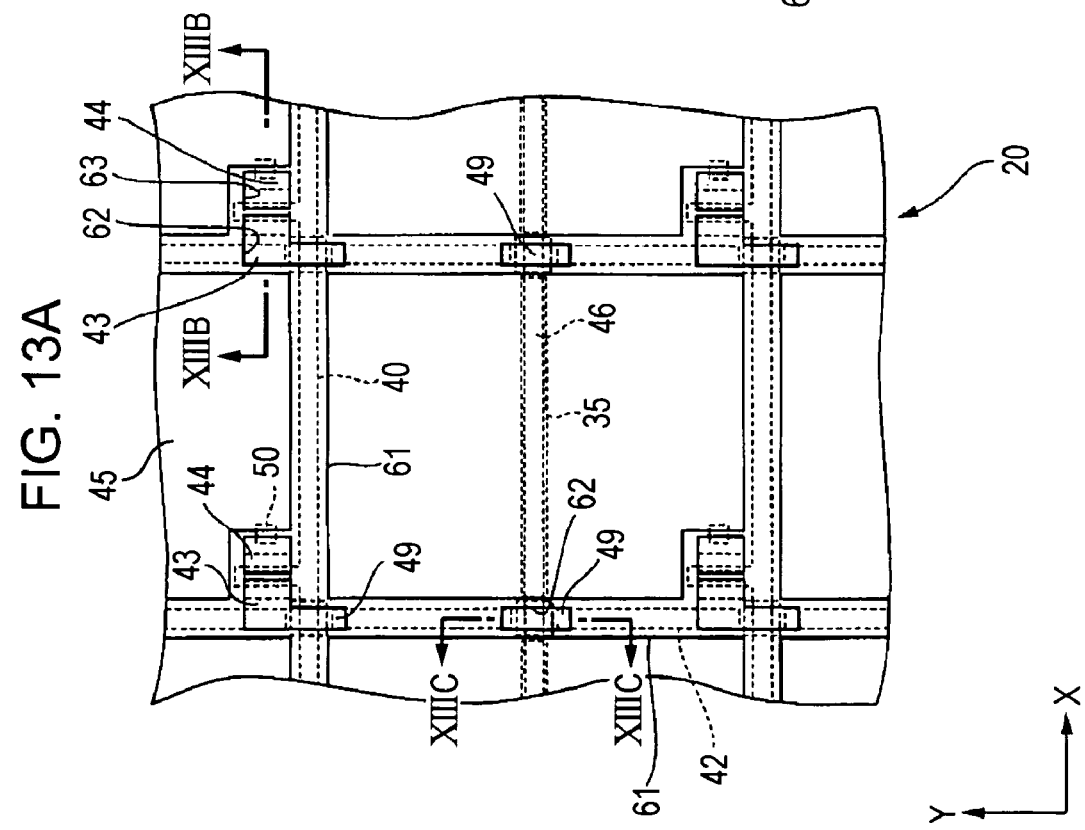

ACTIVE MATRIX SUBSTRATE, METHOD OF MANUFACTURING ACTIVE MATRIX SUBSTRATE, ELECTRO-OPTICAL DEVICE, AND ELECTRONIC APPARATUS

RELATED APPLICATIONS

This application claims priority to Japanese Patent Application No. 2004-247919 filed Aug. 27, 2004 which is hereby expressly incorporated by reference herein in its entirety.

BACKGROUND OF THE INVENTION

1. Technical Field

The present invention relates to an active matrix substrate, a method of manufacturing the active matrix substrate, an electro-optical device, and an electronic apparatus.

2. Related Art

With the spread of portable apparatuses such as notebook computers and cellular phones, thin and light liquid crystal display devices are widely used. Such liquid crystal display devices have a liquid crystal layer interposed between an upper substrate and a lower substrate.

An example of the lower substrate (an active matrix substrate) is shown in FIG. 17. As shown in the figure, the lower substrate 1 includes a glass substrate 2, gate scanning electrodes 3 and source electrodes 4 disposed on the glass substrate 2 to intersect each other, drain electrodes 5 disposed on the glass substrate 2, pixel electrodes (ITO) 6 connected to the drain electrodes 5, insulating layers 7 disposed between the gate scanning electrodes 3 and the source electrodes 4, and TFTs (thin film transistors) made of thin semiconductor material.

For example, as disclosed in Japanese Patent No. 3261699, a technique of repeatedly performing a process in which a dry process and photolithography etching are combined is used for forming metal wires in the lower substrate 1.

A liquid droplet ejecting method is used for forming the drain electrodes 5 and the like in the active matrix substrate described above. That is, the drain electrodes 5 are formed by applying a conductive material between the TFTs 8 and the pixel electrodes 6 with a liquid droplet ejecting apparatus and solidifying the conductive material.

A semiconductor film constituting the TFTs 8 is subjected to a dewatering treatment and thus the semiconductor film and the pixel electrodes 6 have a height difference (the semiconductor film is higher than the pixel electrodes 6). As a result, when the conductive material is applied between the TFTs 8 and the pixel electrodes 6, the conductive material applied onto the semiconductor film flows out toward the pixel electrodes and thus the thickness of the drain electrodes 5 formed on the semiconductor film is reduced, thereby causing a problem that conductivity is deteriorated.

SUMMARY

An advantage of the invention is to provide a method of manufacturing an active matrix substrate in which a conductive material can be prevented from flowing out from a semiconductor film when a conductive film is formed by applying the conductive material between a semiconductor film and pixel electrodes, thereby securing a sufficient thickness of the conductive film.

According to a first aspect of the invention, there is provided an active matrix substrate comprising, on a substrate: lattice-patterned wires, pixel electrodes arranged in an area surrounded with the wires, and switching elements electrically connected to the wires and the pixel electrodes with a conductive film therebetween, wherein an auxiliary conductive portion electrically connecting the pixel electrodes to the conductive film is further provided.

In the first aspect of the invention, since it is not necessary to directly form the conductive film on the pixel electrodes, it is possible to prevent the conductive material from flowing out toward the pixel electrodes.

The auxiliary conductive portion may be formed in the same layer as the wires. Accordingly, it is possible to form the auxiliary conductive portion without increase in the number of processes.

A bank may be provided in a part on the auxiliary conductive portion. Accordingly, since the conductive film can be located at a predetermined position, it is possible to form the conductive film having a sufficient thickness.

According to a second aspect of the invention, there is provided a method of manufacturing an active matrix substrate comprising, on a substrate: lattice-patterned wires, pixel electrodes arranged in an area surrounded with the wires, and switching elements electrically connected to the wires and the pixel electrodes with a conductive film therebetween, wherein an auxiliary conductive portion electrically connecting the pixel electrodes to the conductive film is formed at the same time as forming the wires.

In the second aspect of the invention, since it is not necessary to directly form the conductive film on the pixel electrodes, it is possible to prevent the conductive material from flowing out toward the pixel electrodes.

A bank may be formed in a part on the auxiliary conductive portion before forming the conductive film by using a liquid droplet ejecting method. Accordingly, since the conductive film can be located at a predetermined position, it is possible to form the conductive film having a sufficient thickness.

According to a third aspect of the invention, there is provided an electro-optical device comprising any one of the active matrix substrate according to the first aspect and the active matrix substrate manufactured using the method according to the second aspect. In the third aspect of the invention, it is possible to accomplish improvement of performance of the electro-optical device.

According to a fourth aspect of the invention, there is provided an electronic apparatus comprising the electro-optical device according to the third aspect. In the fourth aspect of the invention, it is possible to accomplish improvement of performance of the electronic apparatus.

BRIEF DESCRIPTION OF THE DRAWING

The invention will be described with reference to the accompanying drawings, wherein like numbers reference like elements and wherein:

FIG. 3 is a diagram illustrating a procedure of manufacturing the active matrix substrate;

FIG. 4 is a diagram illustrating a procedure subsequent to FIG. 3;

FIG. 7 is a diagram illustrating a procedure subsequent to FIG. 4;

FIG. 8 is a diagram illustrating a procedure subsequent to FIG. 7;

FIG. 9 is a diagram illustrating a procedure subsequent to FIG. 8;

FIG. 10 is a diagram illustrating a procedure subsequent to FIG. 9;

FIG. 11 is a diagram illustrating a procedure subsequent to FIG. 10;

FIG. 12 is a diagram illustrating a procedure subsequent to FIG. 11;

FIG. 13 is a diagram illustrating a procedure subsequent to FIG. 12;

DESCRIPTION OF THE EMBODIMENTS

Hereinafter, an active matrix substrate, a method of manufacturing the active matrix substrate, an electro-optical device, and an electronic apparatus according to the present invention will be described with reference to the accompanying drawings.

(Active Matrix Substrate)

Figure 1:
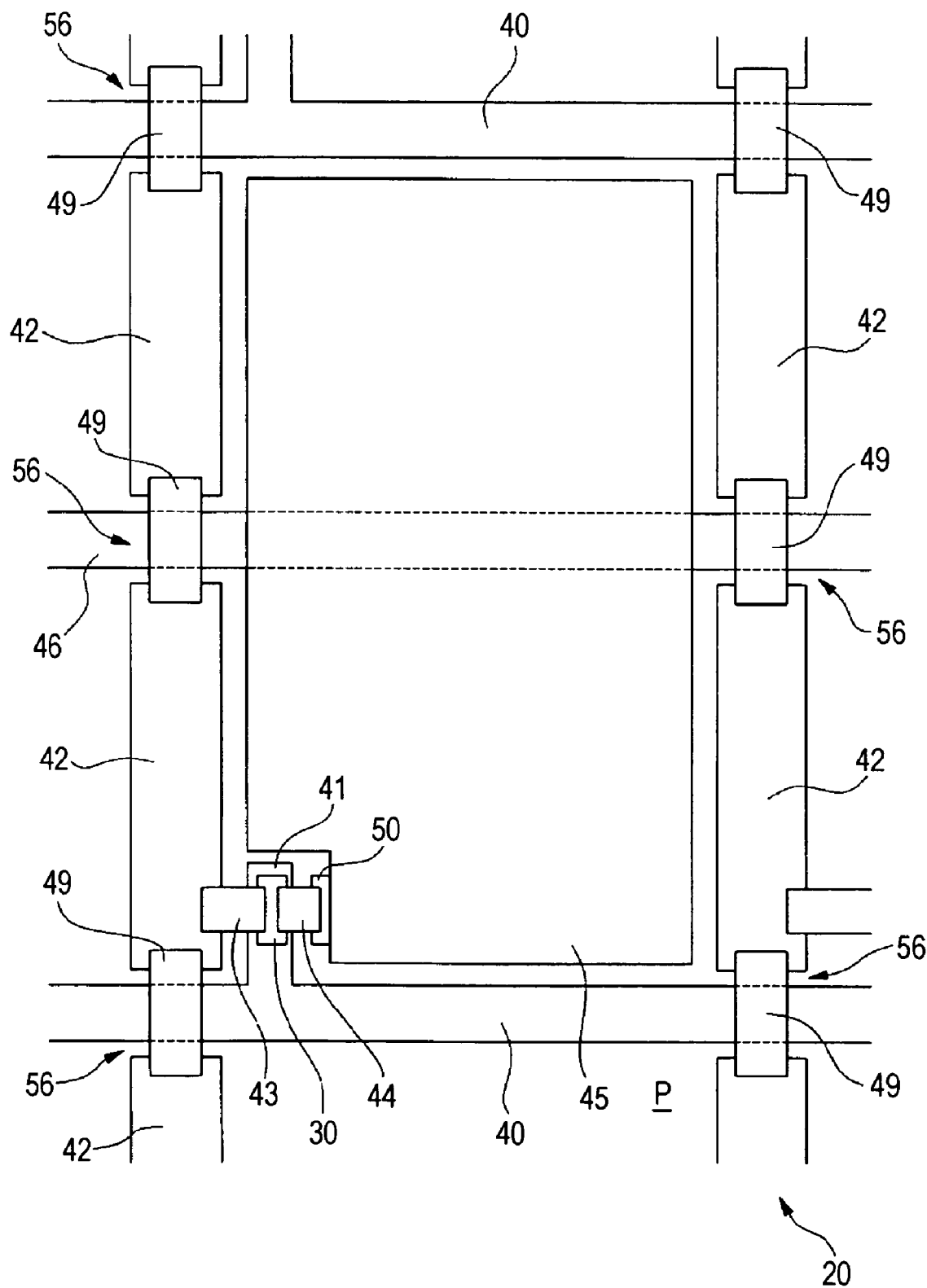
FIG. 1 is a partially enlarged view of an active matrix substrate.

FIG. 1 is a partially enlarged view of an active matrix substrate according to the invention. Gate wires 40 and source wires 42 are formed in a lattice pattern on the active matrix substrate 20. That is, a plurality of gate wires 40 are formed to extend in the X direction and a plurality of source wires 42 are formed to extend in the Y direction.

The gate wires 40 are connected to gate electrodes 41 and a TFT 30 is disposed on each gate electrode 41 with an insulating layer therebetween. On the other hand, the source wires 42 are connected to source electrodes 43 and one end of each source electrode 43 is connected to the TFT (switching element) 30.

Pixel electrodes 45 are disposed in areas surrounded with the gate wires 40 and the source wires 42 and each pixel electrode is connected to a TFT 30 through an auxiliary conductive portion 50 and a drain electrode 44.

Capacitor lines 46 are formed on the active matrix substrate 20 to be approximately parallel to the gate wires 40. The capacitor lines 46 are disposed under the pixel electrodes 45 and the source wires 42 with an insulating layer therebetween.

The gate wires 40, the gate electrodes 41, the source wires 42, the capacitor lines 46, and the auxiliary conductive portion 50 are formed in the same plane.

Figure 2:
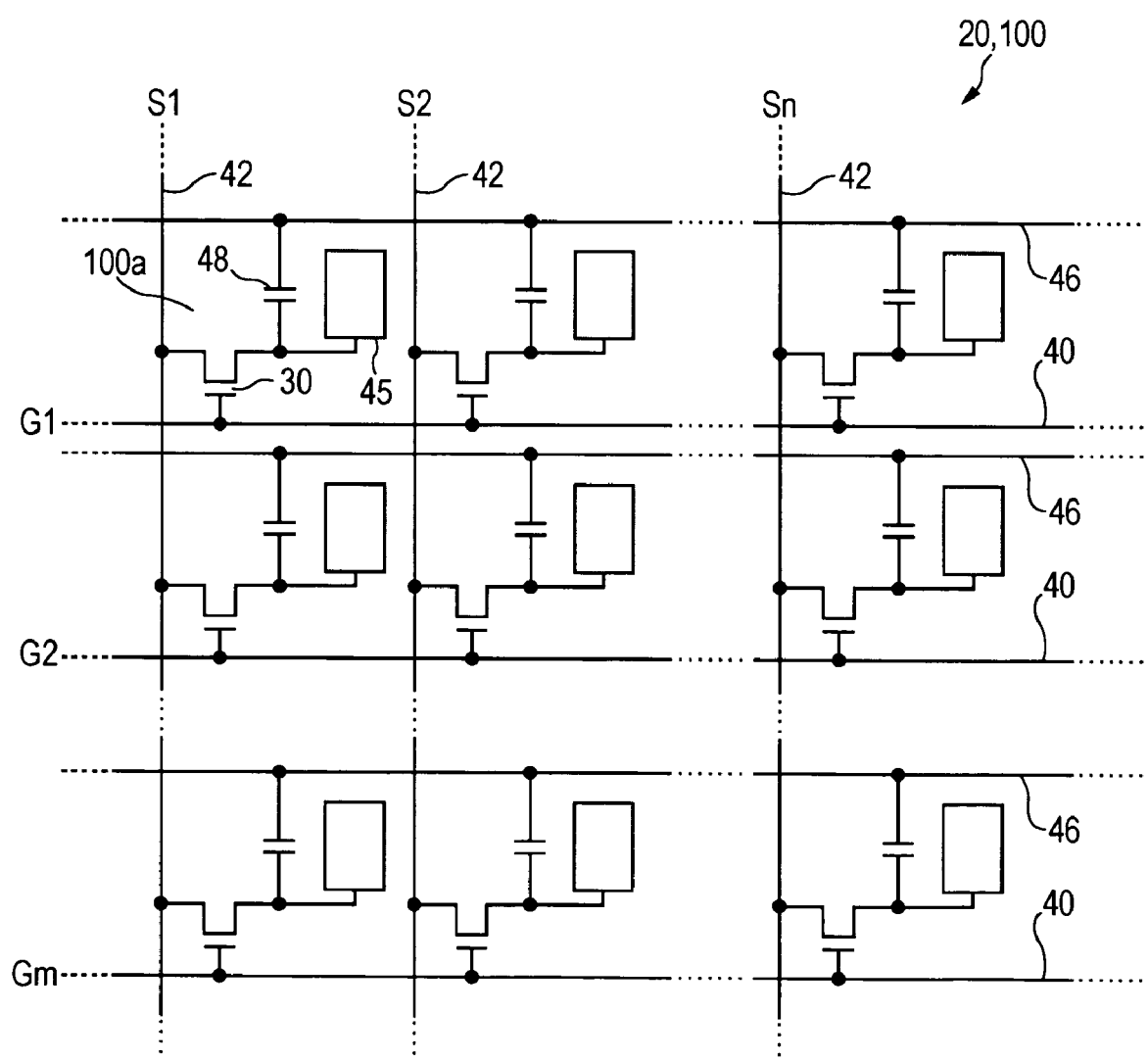
FIG. 2 is an equivalent circuit diagram of the active matrix substrate.

FIG. 2 is an equivalent circuit diagram of the active matrix substrate 20 which is used in a liquid crystal display device.

When the active matrix substrate 20 is used in a liquid crystal display device 100, a plurality of pixels 100a are formed in a matrix in an image display area. In each pixel 100a, a pixel switching TFT 30 is formed and a source wire 42 for supplying pixel signals S1, S2, . . . , Sn is electrically connected to the source of the TFT 30 through a source electrode 43. The pixel signals S1, S2, . . . , Sn may be supplied line-sequentially to the source wire 42 in that order and may be supplied to a plurality of source wires 42 adjacent to each other in a unit of groups.

The gate wire 40 is electrically connected to the gate of the TFT 30 through a gate electrode 41. At a predetermined time point, scanning signals G1, G2, . . . , Gn are supplied in pulses line-sequentially to the gate wire 40 in that order.

The pixel electrode 45 is electrically connected to the drain of the TFT 30 through a drain electrode 44. By turning on the TFT 30 as a switching element only for a predetermined period of time, the pixel signals S1, S2, . . . , Sn supplied from the source wires 42 are written to the pixels at a predetermined time point. In this way, the pixel signals with a predetermined level written to liquid crystal through the pixel electrodes 45 are held between a counter electrode 121 of a counter substrate 120 shown in FIG. 15 and the pixel electrodes for a predetermined period of time.

In order to prevent the held pixel signals S1, S2, . . . , Sn from leaking, storage capacitors 48 are provided in parallel to liquid crystal capacitors formed between the pixel electrodes 45 and the counter electrode 121 out of the capacitor lines 46. For example, the voltage of the pixel electrodes 45 is held by the storage capacitors 48 for a period of time that is three orders of magnitude larger than the time for which the source voltage is applied. Accordingly, the charge holding characteristic can be improved, thereby embodying the liquid crystal display device 100 having a high contrast ratio.

(Method of Manufacturing Active Matrix Substrate)

Next, a method of manufacturing the active matrix substrate 20 will be described with reference to the drawings.

The active matrix substrate 20 is manufactured through a first process of forming lattice-patterned wires on a substrate P, a second process of forming a stacked portion 35, and a third process of forming the pixel electrodes 45, etc.

Now, the respective processes are described in detail.

(First Process: Formation of Wires)

FIGS. 3 and 4 are diagrams illustrating a wire forming process as the first process. FIGS. 3B and 4B are cross-sectional views taken along Line A-A' of FIGS. 3a and 4A, respectively.

The substrate P on which the lattice-patterned wires such as the gate wires 40 and the source wires 42 are formed may be made of various materials such as glass, quartz glass, Si wafer, plastic film, metal plate, or the like. The substrate includes a semiconductor film, a metal film, a dielectric film, an organic film, or the like formed on the surface of the substrate made of the various materials.

As shown in FIG. 3A, first, banks 51 made of insulating organic resin are formed on the substrate P. The banks are used to dispose wiring ink to be described later at a predetermined position of the substrate P.

Specifically, as shown in FIG. 3, the banks 51 having a plurality of openings 52, 53, 54, 55, and 57 corresponding to positions at which the lattice-patterned wires should be formed are formed on the surface of the cleaned substrate P by using a photolithography method.

The banks 51 may be made of a polymer material such as acryl resin, polyimide resin, olefin resin, or melamine resin. A lyophobic treatment is performed to the banks 51 so as to dispose the wiring ink into the openings 52, 53, 54, 55, and 57. As the lyophobic treatment, a $CF_4$ plasma process (a plasma process with a gas containing fluorine) is carried out. Instead of the $CF_4$ plasma process, the banks 51 may be filled with a lyophobic component (such as fluorine group) in advance.

The openings 52, 53, 54, 55, and 57 formed by the banks 51 correspond to the lattice-patterned wires such as the gate wires 40 and the source wires 42. That is, by arranging the wiring ink in the openings 52, 53, 54, 55, and 57 of the banks 51, the lattice-patterned wires such as the gate wires 40 and the source wires 42 are formed.

Specifically, the openings 52 and 53 formed to extend in the X direction correspond to the positions at which the gate wires 40 and the capacitor lines 46 should be formed. The openings 54 corresponding to the positions at which the gate electrodes 41 should be formed are connected to the openings 52 corresponding to the positions at which the gate wires 40 should be formed. The openings 55 formed to extend in the Y direction correspond to the positions at which the source wires 42 should be formed. The openings 55 extending in the Y direction are divided at the intersections 56 so as not to intersect the openings 52 and 53 extending in the X direction.

The openings 57 formed by the banks 51 correspond to the positions at which the auxiliary conductive portions 50 for electrically connecting the drain electrodes 44 to the pixel electrodes 45 should be formed.

Next, by ejecting and arranging the wiring ink containing conductive particles in the openings 52, 53, 54, 55, and 57 with the liquid droplet ejecting apparatus IJ to be described later, the lattice-patterned wires such as the gate wires 40 and the source wires 42 and the auxiliary conductive portions 50 are formed on the substrate.

The wiring ink includes a solution in which conductive particles are dispersed in a dispersion medium or a solution in which organic silver compounds or silver oxide nanoparticles are dispersed in a solvent (dispersion medium). The conductive particles may include particles of conductive polymer or super-semiconductor, as well as metal particles of gold, silver, copper, tin, lead, or the like. The conductive particles may be coated with an organic material so as to improve the dispersion characteristic.

It is preferable that the diameter of the conductive particles is in the range from 1 nm to 0.1 μm. When the particle diameter is greater than 0.1 μm, a nozzle of a droplet ejecting head to be described later may be clogged. When the particle diameter is smaller than 1 nm, the volume ratio of a coating agent to the conductive particles is increased and thus the ratio of organic materials contained in the resultant film is too great.

The dispersion medium is not particularly limited if it can only disperse the conductive particles and does not cause cohesion. Examples of the dispersion medium may include water, alcohols such as methanol, ethanol, propanol, butanol, etc., hydrocarbon compounds such as n-heptane, n-octane, decane, dodecane, tetradecane, toluene, xylene, cymene, durene, indene, dipentene, tetrahydro naphthalene, decahydro naphthalene, cyclohexyl benzene, etc., ether compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxy ethane, bis (2-methoxy ethyl) ether, p-dioxane, etc., polar compounds such as propylene carbonate, γ-butyrolactone, B-methyl-2-pyrrolidone, dimethyl formamide, dimethyl sulfoxide, cyclohexanone, etc., and so on. Among the above-mentioned compounds, from the view point of a dispersion property of particles, stability of a dispersion liquid, and easy application to the liquid droplet ejecting method (inkjet method), water, alcohols, hydrocarbon compounds, and ether compounds are preferable as the dispersion medium, and water and hydrocarbon compounds are most preferable as the dispersion medium.

It is preferable that the surface tension of the solution in which the conductive particles are dispersed is in the range from 0.02 N/m to 0.07 N/m. In ejecting liquid by the inkjet method, when the surface tension is smaller than 0.02 N/m, wettability of the ink compositions on the nozzle surface is increased and thus a curved ejection trajectory can be easily caused. On the other hand, when the surface tension is greater than 0.07 N/m, the meniscus shape at the nozzle end is not stabilized and thus it is difficult to control the amount of ejection or the timing of ejection. In order to adjust the surface tension, a surface tension adjusting agent such as a fluorine agent, a silicon agent, and a nonionic agent may be slightly added to the dispersion liquid within a range in which a contact angle with the substrate is not greatly decreased. The nonionic surface-tension adjusting agent improves the wettability of a liquid on the substrate and the planar property of a film, thereby preventing micro unevenness of the film. The surface-tension adjusting agent may contain organic compounds such as alcohol, ether, ester, and ketone as needed.

It is preferable that the viscosity of the dispersion liquid is in the range from 1 m·Pa·s to 50 m·Pa·s. In ejecting a liquid material in droplets by using the inkjet method, when the viscosity is smaller than 1 m·Pa·s, the surroundings of the nozzle can be easily contaminated due to the outflow of ink. When the viscosity is greater than 50 m·Pa·s, the frequency of clogging of the nozzle is increased, thereby making it difficult to smoothly eject the liquid droplets.

After ejecting the wiring ink to the substrate P, a dry process and a baking process are carried out as needed so as to remove the dispersion medium.

The dry process can be performed by heating the substrate P with a hot plate, an electric furnace, or the like. The heating is performed, for example, at a temperature of 180° C. for 60 minutes.

The process temperature of the baking process is properly determined in consideration of the boiling point (vapor pressure) of the dispersion medium, the thermal behavior such as dispersion property or oxidation property of the particles, the amount of coating agent, the heat-proof temperature of a base material, and the like. For example, in order to remove the coating agent made of organic materials, it is necessary to perform the baking process at a temperature of 250° C.

The electrical contact between the conductive particles can be secured by means of the dry process and the baking process, thereby obtaining a conductive film.

A protective metal film 47 may be formed on the wires such as the gate wires 40 or the source wires 42 and the auxiliary conductive portion 50. The protective metal film 47 is a thin film for suppressing a (electro) migration phenomenon of the conductive film made of silver or copper. It is preferable that the protective metal film 47 is made of nickel. The protective metal film 47 made of nickel is ejected and formed on the substrate P by using the liquid droplet ejecting method.

Through the processes described above, as shown in FIG. 4, a layer including the banks 51, the lattice-patterned wires, and the auxiliary conductive portions 50 is formed on the substrate P.

Examples of ejection techniques of the liquid droplet ejecting method can include a charging control technique, a pressing vibration technique, an electro-mechanical conversion technique, an electro-thermal conversion technique, and an electrostatic suction technique. In the charging control technique, a material to be deposited is charged with a charging electrode and the deposition direction of the material is controlled with a deflecting electrode, thereby ejecting the material from the nozzles. In the pressing vibration technique, a high pressure of about 30 kg/cm$^2$ is applied to a material to eject the material from the nozzles. Here, when a control voltage is not applied, the material is ejected with a straight trajectory from the nozzles. When the control voltage is applied, electrostatic repulsion occurs in the material and the material is deflected and thus not ejected from the nozzles. The electro-mechanical conversion technique utilizes a property that a piezoelectric element is deformed with a pulse-like electrical signal. Here, a pressure is applied to a space storing the material through a flexible material by means of the deformation of the piezoelectric element to push up the material from the space, thereby ejecting the material from the nozzles.

In the electro-thermal conversion technique, the material is suddenly vaporized generating bubbles with a heater provided in the space storing the material and the material in the space is ejected by means of the pressure of the bubbles. In the electrostatic suction technique, the material is ejected by applying a minute pressure to the space storing the material to form a meniscus of the material at the nozzles and then applying an electrostatic attractive force. In addition, a technique utilizing variation in the viscosity of a fluid provided with an applied electric field or a technique of ejecting the material with discharged sparks may be used. The liquid droplet ejecting method has a merit that materials are negligibly wasted and a desired amount of material can be accurately deposited at a desired position. The amount of liquid material (fluid) to be ejected in one droplet in the liquid droplet ejecting method is about 1 to 300 ng.

Figure 5:
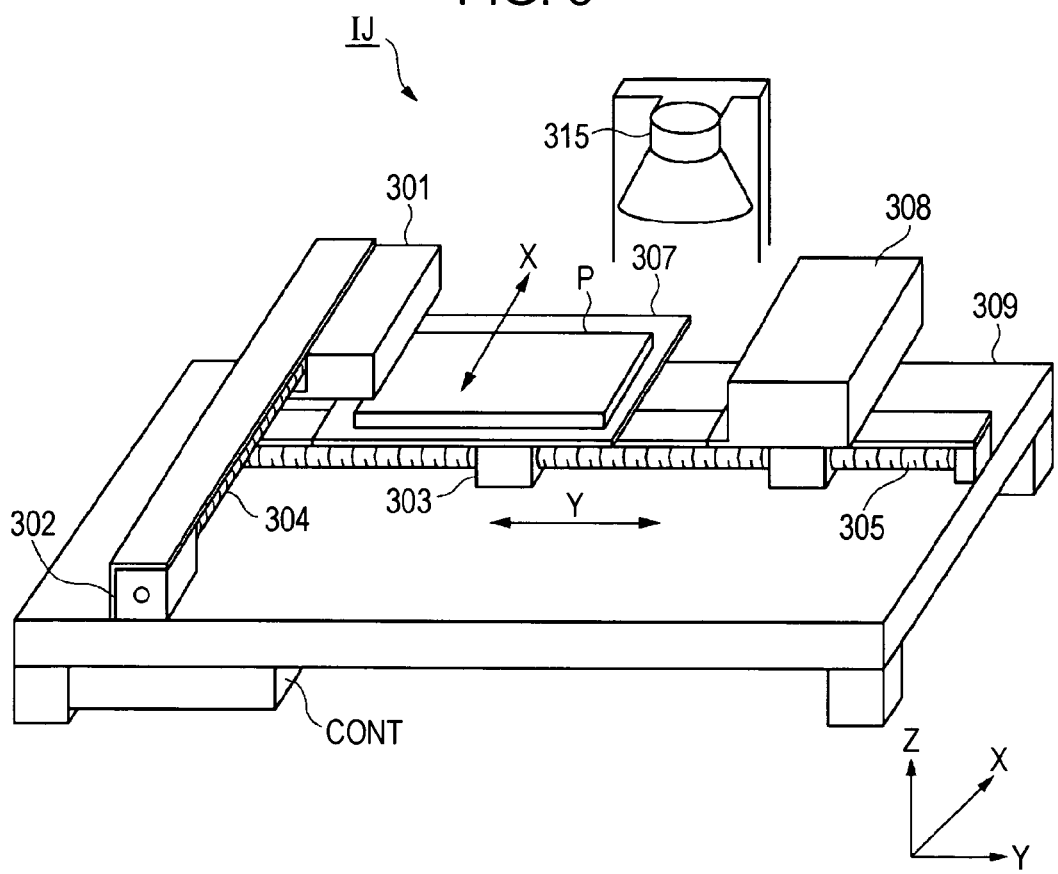
FIG. 5 is a schematic perspective view of a liquid droplet ejecting apparatus.

The liquid droplet ejecting apparatus IJ shown in FIG. 5 is used as a liquid droplet ejecting apparatus used for forming the lattice-patterned wires.

The liquid droplet ejecting apparatus (inkjet apparatus) IJ ejects (drops) droplets to the substrate P from a droplet ejecting head and includes a droplet ejecting head 301, an X direction driving axis 304, a Y direction guide axis 305, a controller CONT, a stage 307, a cleaning mechanism 308, a stand 309, and a heater 315. The stage 307 supports the substrate P on which ink (liquid material) is arranged by the liquid droplet ejecting apparatus IJ and includes a fixing mechanism (not shown) for fixing the substrate P to a reference position.

The droplet ejecting head 301 is a multinozzle-type droplet ejecting head having a plurality of ejecting nozzles. Here, the longitudinal direction corresponds to the Y axis direction. A plurality of ejecting nozzles is provided with a constant separation in the Y axis direction on the lower surface of the droplet ejecting head 301. The ink containing the conductive particles is ejected to the substrate P supported by the stage 307 from the ejecting nozzles of the droplet ejecting head 301.

The X direction driving axis is connected to an X direction driving motor 302. The X direction driving motor 302 may be a stepping motor and rotates the X direction driving axis 304 in response to an X direction driving signal from the controller CONT. When the X direction driving axis 304 is rotated, the droplet ejecting head 301 is moved in the X axis direction.

The Y direction guide axis 305 is fixed to the stand 309. The stage 307 comprises a Y direction driving motor 303. The Y direction driving motor 303 may be a stepping motor and moves the stage 307 in the Y axis direction in response to a Y direction driving signal from the controller CONT.

The controller CONT supplies a droplet ejection control voltage to the droplet ejecting head 301. The controller supplies a driving pulse signal for controlling the movement of the droplet ejecting head 301 in the X direction to the X direction driving motor 302 and supplies a driving pulse signal for controlling the movement of the stage 307 in the Y direction to the Y direction driving motor 303.

The cleaning mechanism 308 cleans the droplet ejecting head 301. The cleaning mechanism 308 includes a Y direction driving motor (not shown). The cleaning mechanism 308 is moved along the Y direction guide axis 305 by means of operating the Y direction driving motor. The movement of the cleaning mechanism 308 is also controlled by the controller CONT.

The heater 315 is a device for heating the substrate P by means of annealing with a lamp and performs vaporization and drying of the solvent contained in the liquid material applied on the substrate P. The operation of the heater 315 is also controlled by the controller CONT.

The liquid droplet ejecting apparatus IJ ejects droplets to the substrate P while allowing the droplet ejecting head 301 to scan the stage 307 supporting the substrate P. Hereinafter, the X direction is referred to as a scan direction and the Y direction perpendicular to the X direction is referred to as a non-scan direction.

Accordingly, the ejecting nozzles of the droplet ejecting head 301 are arranged with a constant separation in the Y direction which is the non-scan direction. In FIG. 3, the droplet ejecting head 301 is disposed perpendicular to the moving direction of the substrate P, but the orientation of the droplet ejecting head 301 may be adjusted to intersect the moving direction of the substrate P. As a result, by adjusting the orientation of the droplet ejecting head 301, it is possible to adjust the pitch between the nozzles. A distance between the substrate P and the nozzle surface may be adjusted.

Figure 6:
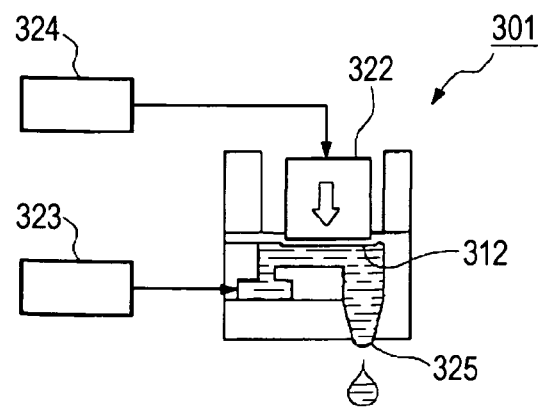
FIG. 6 is a cross-sectional view of a droplet ejecting head.

FIG. 6 is a cross-sectional view of the droplet ejecting head 301.

The droplet ejecting head 301 is provided with a piezoelectric element 322 adjacent to a liquid chamber 321 for receiving the liquid material (wiring ink, etc.). The liquid chamber 321 is supplied with the liquid material through a liquid material supply system 323 including a material tank for storing the liquid material.

The piezoelectric element 322 is connected to a driving circuit 324. By applying a voltage to the piezoelectric element 322 through the driving circuit 324 to and deforming it, the liquid chamber 321 is deformed and thus the liquid material is ejected from the nozzles 325.

In this case, the amount of distortion of the piezoelectric element 322 is controlled by varying the value of the applied voltage. In addition, the speed of distortion of the piezoelectric element 322 is controlled by varying the frequency of the applied voltage. Since the ejection of droplets using the piezoelectric method does not heat the material, it does not affect the composition of the material.

(Second Process: Formation of Stacked Portion)

FIGS. 7 to 10 are views illustrating a process of forming a stacked portion as a second process. FIGS. 7B to 10B are cross-sectional views taken along Line A-A' in FIGS. 7A to 10A and FIGS. 8C to 10C are cross-sectional views taken along Line B-B' in FIGS. 7A to 10A, respectively. In the second process, the stacked portion 35 including an insulating film 31 and a semiconductor film (contact layer 33 and active layer 32) is formed at a predetermined position on the layer including the banks 51, the lattice-patterned wires, and the auxiliary conductive portions 50.

First, by using a plasma CVD method, the insulating film 31, the active layer 32, and the contact layer 33 are sequentially formed on the entire surface of the substrate P. Specifically, as shown in FIG. 7, a silicon nitride film as the insulating film 31, an amorphous silicon film as the active layer 32, and an n+ type silicon film as the contact layer 33 are sequentially formed by varying the raw material gas or the plasma condition.

Next, as shown in FIG. 8, resists 58 (58a to 58c) are disposed at predetermined positions by using a photolithography method. The predetermined positions mean positions on intersections between the gate wires 40 and the source wires 42, on the gate electrodes 41, and the capacitor lines 46, as shown in FIG. 8A.

The resist 58a disposed on the intersections 56 and the resists 58b disposed on the capacitor lines 46 are formed so as to not contact each other. As shown in FIG. 8B, grooves 59 are formed in the resists 58c disposed on the gate electrodes 41 by performing a half exposure.

Next, by etching the entire surface of the substrate P, the contact layer 33 and the active layer 32 are removed. In addition, by performing an etching process, the insulating film 31 is removed.

As a result, as shown in FIG. 9, the contact layer 33, the active layer 32, and the insulating film 31 are removed from the areas other than the predetermined positions at which the resists 58 (58a to 58c) are disposed. On the other hand, the stacked portion 35 including the insulating film 31 and the semiconductor film (contact layer 33 and active layer 32) is formed at the predetermined positions at which the resists 58 are disposed.

In the stacked portions 35 formed on the gate electrodes 41, the grooves 59 are formed in the resists 58c by performing the half exposure and thus grooves are formed by again performing the half exposure before performing the etching. As shown in FIG. 9B, the contact layer 33 corresponding to the grooves 59 is removed and is divided in two. As a result, the TFTs 30 as switching elements including the active layer 32 and the contact layer 33 are formed on the gate electrodes 41.

As shown in FIG. 10, a silicon nitride film as the protective film 60 for protecting the contact layer 33 is formed on the entire surface of the substrate P. In this way, the formation of the stacked portion 35 is completed.

(Third Process)

FIGS. 11 to 13 are views illustrating a process of forming the pixel electrodes 45 as a third process. FIGS. 11B to 13B are cross-sectional views taken along Line A-A' in FIGS. 11A to 13A and FIGS. 11C to 13C are cross-sectional views taken along Line B-B' in FIGS. 11A to 13A, respectively.

In the third process, the source electrodes 43, the drain electrodes 44, the connection wires 49, and the pixel electrodes 45 are formed.

The source electrodes 43, the drain electrodes 44, the connection wires 49, and the pixel electrodes 45 may be all made of a light-transmitting material such as ITO (Indium Tin Oxide). The electrodes are formed using the liquid droplet ejecting method similarly to the first process.

First, banks 61 are formed using the photolithography method so as to cover the gate wires 40 and the source wires 42. That is, as shown in FIG. 11, the lattice-shaped banks 61 are formed. The banks 61 cover a part of the auxiliary conductive portions 50.

Openings 62 are formed in the intersections 56 between the source wires 42 and the gate wires 40 and between the source wires 42 and the capacitor lines 46. As shown in FIG. 11B, the openings 62 are formed to expose a part of the stacked portions 35 (TFT 30) formed on the gate electrodes 41.

Openings 63 are formed to expose a part of the stacked portions 35 (TFT 30). Accordingly, the banks 61 are formed to divide each stacked portion 35 (TFT 30) into two parts in the X direction.

The openings 63 are formed to expose a part of the auxiliary conductive portions 50. Accordingly, the banks 61 are formed to divide each auxiliary conductive portion 50 into two parts in the X direction.

In addition, the banks 61 may be made of polymers such as acryl resin, polyimide resin, olefin resin, and melamine resin, similarly to the banks 51. The banks 61 are subjected to the lyophobic process, similarly to the banks 51.

The openings 62 formed by the banks 61 correspond to the positions at which the connection wires 49 for connecting the divided source wires 42 or the source electrodes 43 should be formed. The openings 63 formed by the banks 61 correspond to the positions at which the drain electrodes 44 should be formed. The areas surrounded with the banks 61 correspond to the positions at which the pixel electrodes 45 should be formed.

That is, by arranging a transparent conductive material in the openings 62 and 63 of the banks 61 and in the areas surrounded with the banks 61, the connection wires 49 for connecting the divided source wires 42, the source electrodes 43, the drain electrodes 44, and the pixel electrodes 45 are formed. A conductive material other than the transparent conductive material may be arranged in the openings 62 and 63.

Next, the protective film 60 formed on the entire surface of the substrate P is removed by an etching process. As a result, as shown in FIG. 12, the protective layer 60 formed in the areas in which the banks 61 are not formed is removed. The protective metal film 47 formed on the lattice-patterned wires is removed.

Next, the transparent conductive material is ejected and arranged in the openings 62 and 63 of the banks 61 and in the areas surrounded with the banks 61. A dispersion liquid in which ITO conductive particles are dispersed in a dispersion medium can be used as the transparent conductive material.

After ejecting the transparent conductive material to the substrate P, a dry process and a baking process are performed so as to remove the dispersion medium as needed. By means of the dry process and the baking process, the electrical contact between the conductive particles is secured, thereby obtaining a conductive film.

As a result, as shown in FIG. 13, the connection wires 49 for connecting the divided source wires 42, the source electrodes 43, the drain electrodes 44, and the pixel electrodes 45 are formed on the substrate P.

In the embodiments, the method of arranging the transparent conductive material by using the liquid droplet ejecting method has been described. However, the transparent conductive material may be arranged by performing the CVD process and the etching process. In this case, the banks 61 are not required.

The active matrix substrate 20 is manufactured through the processes described above.

Since the drain electrodes 44 are formed by arranging the conductive material in the openings 63, it is possible to form the drain electrodes 44 having a sufficient thickness. That is, the contact layer 33 is lyophobic and the contact layer 33 and the pixel electrodes 45 have a height difference. Accordingly, when the openings 63 formed by the banks 61 do not exist, the conductive material flows out toward the pixel electrodes and thus the thickness of the drain electrodes 44 is reduced. Therefore, by providing the openings 63 formed by the banks 61, the conductive material can be prevented from flowing out, thereby forming the drain electrodes 44 having a sufficient thickness.

Since the auxiliary conductive portions 50 are formed to be exposed on the bottom surface of the openings 63, it is possible to definitely realize the electrical connection between the drain electrodes 44 and the pixel electrodes 45.

As a result, the decrease in conductivity of the drain electrodes 45 can be prevented, thereby obtaining the active matrix substrate 20 having a desired performance.

In the embodiment, the case where the source wires 42 are divided at the intersections 56 has been described. However, the gate wires 40 may be divided at the intersections 56.

The invention is not limited to the case where the wires such as the source wires 42 are divided at the intersections 56.

Although the case where the gate wires 40, the source wires 42, and the capacitor lines 46 are formed using the liquid droplet ejecting method has been described, they may be formed using a CVD method. Accordingly, the auxiliary conductive portions 50 may be formed using the CVD method.

(Electro-Optical Device)

Next, a liquid crystal display device 100 as an example of an electro-optical device employing the active matrix substrate 20 will be described.

Figure 14:
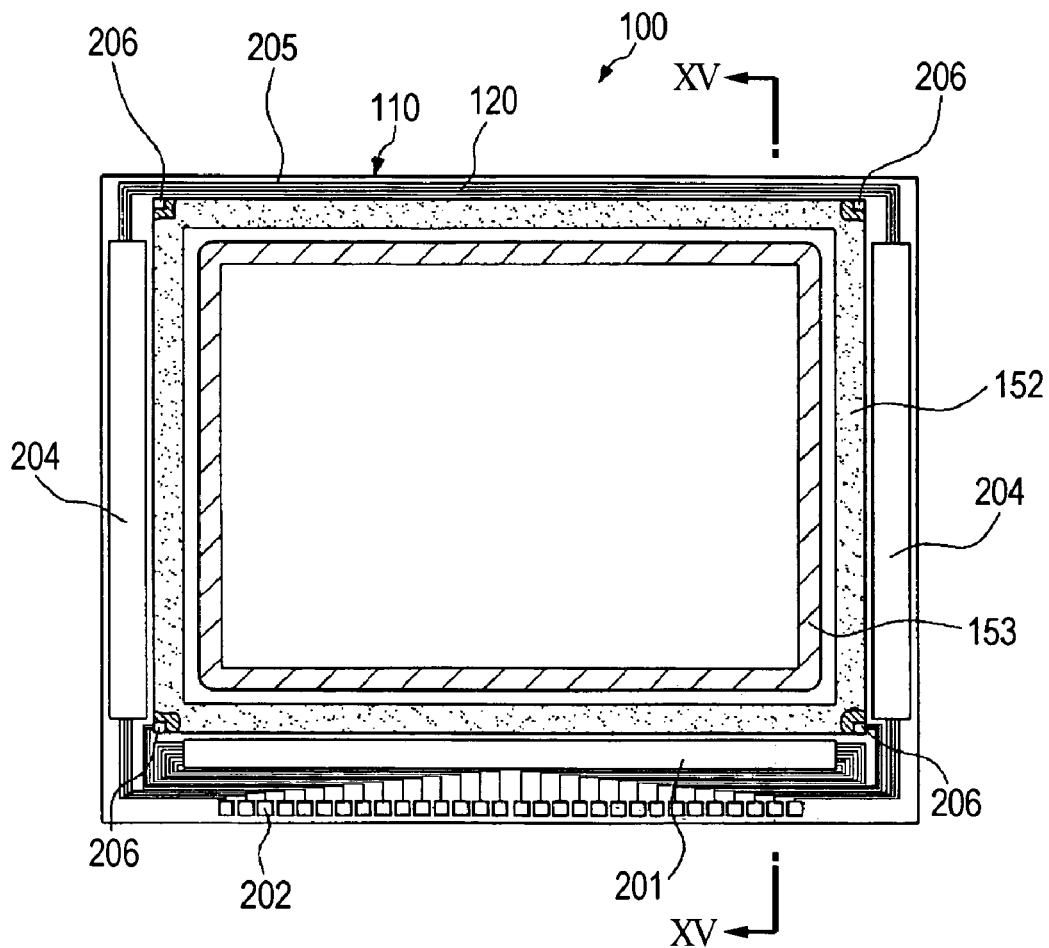
FIG. 14 is a plan view of a liquid crystal display device as seen from a counter substrate.
Figure 15:
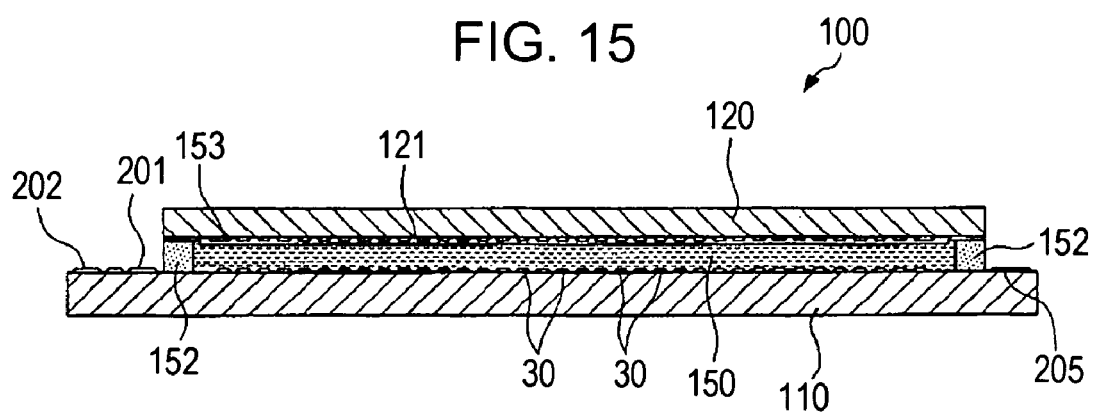
FIG. 15 is a cross-sectional view of the liquid crystal display device.

FIG. 14 is a plan view of the liquid crystal display device 100 as shown from the counter substrate and FIG. 15 is a cross-sectional view taken along Line H-H' of FIG. 14.

In the drawings referred to in the following description, in order to recognize the layers and the members, scales of the layers and the members are different.

In FIGS. 14 and 15, the liquid crystal display device (electro-optical device) 100 has a TFT array substrate 110 having the active matrix substrate 20 and a counter substrate 120 which are bonded to each other with a sealing member 152 as a photo-curing enclosing material. The liquid crystal 150 is injected and held in the area on the substrate surface. The sealing member 152 is formed in a closed frame shape in the substrate and has no sealing trace without a liquid crystal injection port.

A peripheral partitioning portion 153 made of a light-shielding material is formed inside the sealing member 152. A data-line driving circuit 201 and mounting terminals 202 are formed along one side of the TFT array substrate 110 outside the sealing member 152 and scanning-line driving circuits 204 are formed along two sides adjacent to the one side. A plurality of wires 205 for connecting the scanning-line driving circuits 204 provided at both sides of the image display area are provided along the other side of the TFT array substrate 110. An inter-substrate electrical connection member 206 for electrically connecting the TFT array substrate 110 and the counter substrate 120 is disposed in at least one corner of the counter substrate 120.

Instead of forming the data-line driving circuit 201 and the scanning-line driving circuits 204 on the TFT array substrate 110, terminal groups formed in the peripheral portions of a TAB (Tape Automated Bonding) substrate mounted with a driving LSI and the TFT array substrate 110 may be electrically and mechanically connected through an anisotropic conductive film.

In the liquid crystal display device 100, a retardation film, a polarizing film, and the like are arranged in a predetermined direction in accordance with the kinds of the liquid crystal 150 to be used, that is, operation modes such as TN (Twisted Nematic) mode, C-TN mode, VA mode, and IPS mode, or normally-white mode/normally-black mode, but are not shown.

When the liquid crystal display device 100 is formed for color display, color filters of red (R), green (G), and blue (B) along with protective films thereof are formed in the areas on the counter substrate 120 opposed to the pixel electrodes on the TFT array substrate 110.

The electro-optical device employing the active matrix substrate 20 may be an organic EL (Electroluminescence) display device.

The organic EL display device has a structure that a thin film including inorganic and organic fluorescent compounds is interposed between a cathode and an anode. The organic EL display device generates excitons by injecting and exciting electrons and holes into the thin film and emits light by using the emission of light when the excitons are recombined.

By providing the active matrix substrate 20 having the TFTs 30 with materials exhibiting red, green, and blue colors, that is, materials for light-emitting layers, and materials for hole injecting layer and electron transport layers in an ink type and patterning the respective materials, it is possible to manufacture a self-emission full color organic EL display device.

The active matrix substrate 20 can be applied to a surface conduction type electron emission device or the like using a phenomenon that electron emission occurs by allowing current to flow in a small-area thin film formed on PDP (Plasma Display Panel) or a substrate to be parallel to the film surface.

(Electronic Apparatus)

Next, a specific example of an electronic apparatus according to the invention will be described.

Figure 16A:
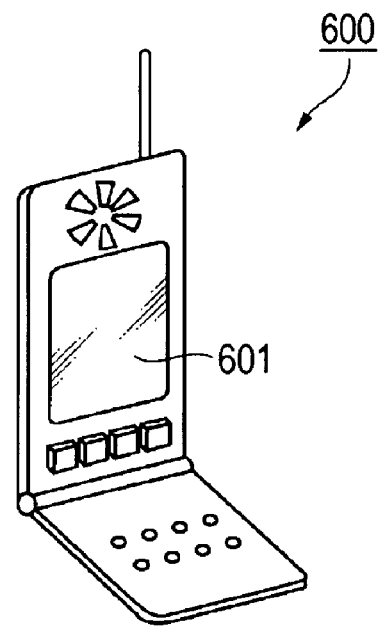
FIG. 16 is a diagram illustrating a specific example of an electronic apparatus.

FIG. 16A is a perspective view illustrating an example of a cellular phone. In FIG. 16A, reference numeral 600 denotes a cellular phone body and reference numeral 601 denotes a display unit having the liquid crystal display device 100 according to the above-mentioned embodiment.

Figure 16B:
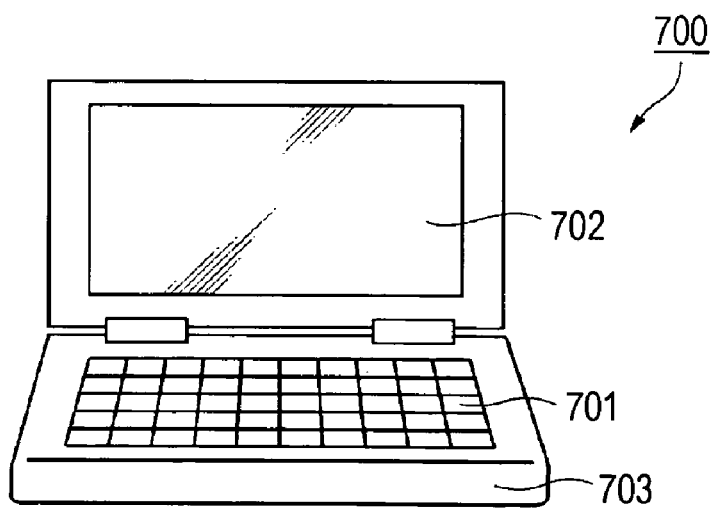

FIG. 16B is a perspective view illustrating an example of a portable information processing apparatus such as a word processor and a personal computer. In FIG. 16B, reference numeral 700 denotes an information processing apparatus, reference numeral 701 denotes an input unit such as a keyboard, reference numeral 703 denotes an information processing apparatus body, and reference numeral 702 denotes a display unit having the liquid crystal display device 100 according to the above-mentioned embodiment.

Figure 16C:
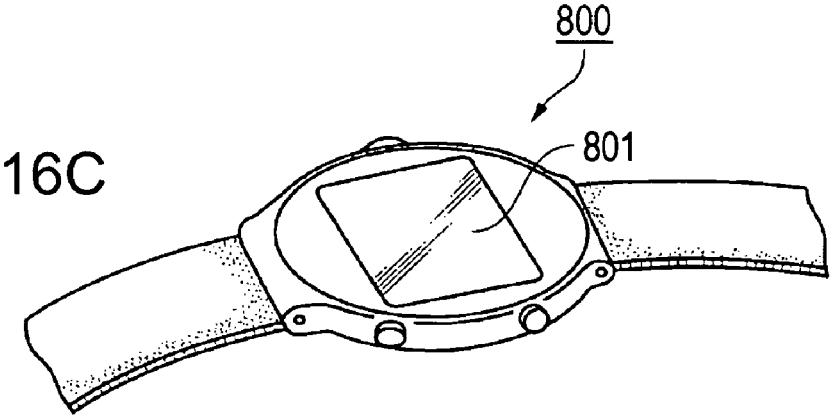
Figure 17:
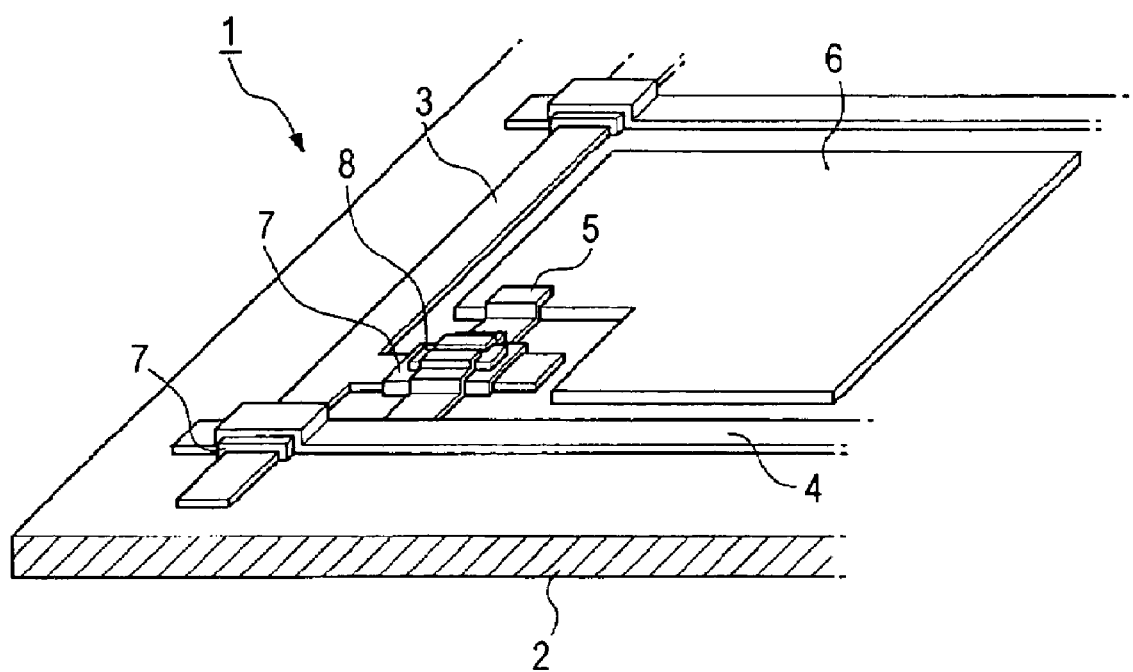
FIG. 17 is a diagram illustrating a conventional active matrix substrate.

FIG. 16C is a perspective view illustrating an example of a wristwatch-type electronic apparatus. In FIG. 16C, reference numeral 800 denotes a watch body and reference numeral 801 denotes a display unit having the liquid crystal display device 100 according to the above-mentioned embodiment.

As a result, since the electronic apparatuses shown in FIGS. 16A to 16C have the liquid crystal display device 100 according to the above-mentioned embodiment, it is possible to obtain high quality and performance.

Although the electronic apparatus according to the embodiment has the liquid crystal display device 100, the electronic apparatus may have another electro-optical device such as an organic electroluminescence display device, a plasma display device, and the like.

The embodiment of the invention can be used in a large-sized liquid crystal panel such as a television or monitor.

Although the exemplary embodiments of the present invention have been hitherto described with reference to the accompanying drawings, the invention is not limited to the exemplary embodiments. The shapes or combinations of the elements shown in the exemplary embodiments are only examples and can be variously changed in response to design requirements without departing from the gist of the invention.

What is claimed is:

1. An active matrix substrate comprising, on a substrate: lattice-patterned wires, pixel electrodes arranged in an area surrounded with the wires, and switching elements electrically connected to the wires and the pixel electrodes with a conductive film therebetween, wherein an auxiliary conductive portion electrically connecting the pixel electrodes to the conductive film is further provided; and the auxiliary conductive portion is formed in the same layer as the wires.

2. The active matrix substrate according to claim 1, wherein a bank is provided in a part of the auxiliary conductive portion.

3. A method of manufacturing an active matrix substrate comprising:
  forming lattice-patterned wires on a substrate,
  forming pixel electrodes arranged in an area surrounded by the wires,
  forming switching elements electrically connected to the wires and the pixel electrodes with a conductive film therebetween,
  forming an auxiliary conductive portion electrically connecting the pixel electrodes to the conductive film the auxiliary conductive portion and the wires being formed at the same time.

4. The method according to claim 3, further comprising forming a bank in a part of the auxiliary conductive portion before forming the conductive film, the conductive film being formed by using a liquid droplet ejecting method.

5. An electro-optical device comprising one of the active matrix substrate according to claim 1 and the active matrix substrate manufactured using the method according to claim 3.

6. An electronic apparatus comprising the electro-optical device according to claim 5.

* * * * *